(12) United States Patent
Lee et al.

(10) Patent No.: US 10,483,304 B2
(45) Date of Patent: Nov. 19, 2019

(54) IMAGE SENSOR

(71) Applicant: SAMSUNG ELECTRONICS CO., LTD, Suwon-si, Gyeonggi-Do (KR)

(72) Inventors: Gwi-Deok Ryan Lee, Suwon-si (KR); Tae Yon Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 111 days.

(21) Appl. No.: 15/786,687

(22) Filed: Oct. 18, 2017

(65) Prior Publication Data

US 2018/0197910 A1    Jul. 12, 2018

(30) Foreign Application Priority Data

Jan. 9, 2017  (KR) .................. 10-2017-0002706

(51) Int. Cl.
| | |
|---|---|
| H01L 27/146 | (2006.01) |
| H04N 5/374 | (2011.01) |
| H04N 5/376 | (2011.01) |
| H04N 5/378 | (2011.01) |
| H04N 5/353 | (2011.01) |
| H04N 5/3745 | (2011.01) |

(52) U.S. Cl.
CPC .... *H01L 27/14609* (2013.01); *H01L 27/1461* (2013.01); *H01L 27/1464* (2013.01); *H01L 27/14605* (2013.01); *H01L 27/14614* (2013.01); *H01L 27/14636* (2013.01); *H01L 27/14643* (2013.01); *H04N 5/353* (2013.01); *H04N 5/374* (2013.01); *H04N 5/378* (2013.01); *H04N 5/3765* (2013.01); *H04N 5/37452* (2013.01); *H01L 27/14621* (2013.01); *H01L 27/14627* (2013.01)

(58) Field of Classification Search
CPC .... H04N 5/353; H04N 5/37452; H04N 5/374; H04N 5/378; H04N 5/3765; H01L 27/14605; H01L 27/14609; H01L 27/1461; H01L 27/14614; H01L 27/14621; H01L 27/14627; H01L 27/14636; H01L 27/1464; H01L 27/14643
See application file for complete search history.

(56) References Cited

U.S. PATENT DOCUMENTS

| | | |
|---|---|---|
| 7,488,997 B2 | 2/2009 | Kuwazawa |
| 8,183,657 B2 | 5/2012 | Kuwazawa |
| (Continued) | | |

FOREIGN PATENT DOCUMENTS

| | | |
|---|---|---|
| JP | 4761491 B2 | 8/2011 |
| JP | 2012010293 A | 1/2012 |
| (Continued) | | |

*Primary Examiner* — Lin Ye
*Assistant Examiner* — Chriss S Yoder, III
(74) *Attorney, Agent, or Firm* — Volentine, Whitt & Francos, PLLC

(57) ABSTRACT

An image sensor includes a light-sensing element that generates charge in response to incident light, a storage diode formed in a substrate, wherein the storage diode stores the charge generated by the light-sensing element, a floating diffusion region formed in a top surface of the substrate and spaced apart from the storage diode, and a transfer gate at least partially buried under the top surface of the substrate, wherein the transfer gate controls the transfer of the charge from the storage diode to the floating diffusion region.

20 Claims, 17 Drawing Sheets

(56) References Cited

U.S. PATENT DOCUMENTS

| | | | |
|---|---|---|---|
| 8,471,315 B1 | 6/2013 | Hynecek et al. | |
| 9,041,072 B2 | 5/2015 | Chen et al. | |
| 9,129,881 B2 | 9/2015 | Kawamura | |
| 9,431,449 B2 | 8/2016 | Toda | |
| 9,548,328 B2 * | 1/2017 | Hasegawa | H01L 27/14612 |
| 2010/0079633 A1 | 4/2010 | Kim | |
| 2011/0079832 A1 * | 4/2011 | Masagaki | H01L 27/14609 257/291 |
| 2014/0347538 A1 * | 11/2014 | Toda | H01L 27/14603 348/308 |
| 2016/0049429 A1 | 2/2016 | Lee et al. | |
| 2016/0056199 A1 | 2/2016 | Kim et al. | |
| 2016/0268322 A1 | 9/2016 | Watanabe et al. | |

FOREIGN PATENT DOCUMENTS

| | | |
|---|---|---|
| JP | 2015082592 A | 4/2015 |
| KR | 20110036995 A | 4/2011 |
| KR | 20130014222 A | 2/2013 |
| WO | WO2012001836 A1 | 1/2012 |
| WO | WO2015059898 A1 | 4/2015 |

* cited by examiner

IMAGE SENSOR

This application claims priority from Korean patent application Ser. No. 10-2017-0002706 filed on Jan. 9, 2017 under 35 U.S.C. 119, the subject matter of which is hereby incorporated by reference.

BACKGROUND

The present inventive concept relates to image sensors, CMOS image sensors, and CMOS image sensors having a global shutter.

An image sensor is a type of semiconductor device that generates an electrical signal in response to incident light. The charge coupled device (CCD) image sensor and complementary metal-oxide semiconductor (CMOS) image sensor are two examples of contemporary image sensors. The exposure of incident light to a CMOS image sensor, for example, may be controlled by a rolling shutter system or a global shutter system.

A global shutter system usually requires a reset period during which pixels of the CMOS image sensor may be exposed to incident light. A variety of contemporary CMOS image sensors include a global shutter system.

SUMMARY

Embodiments of the inventive concept provide an image sensor capable of realizing a global shutter using a vertical transfer gate. However, embodiments of the inventive concept are not restricted to only the illustrated embodiments set forth herein. The above and other embodiments of the inventive concept will become more apparent to one of ordinary skill in the art to which the inventive concept pertains by referencing the detailed description of the inventive concept given below.

In one embodiment, the inventive concept provides an image sensor including; a light-sensing element that generates charge in response to incident light, a storage diode formed in a substrate, wherein the storage diode stores the charge generated by the light-sensing element, a floating diffusion region formed in a top surface of the substrate and spaced apart from the storage diode, and a transfer gate at least partially buried under the top surface of the substrate, wherein the transfer gate controls the transfer of the charge from the storage diode to the floating diffusion region.

In another embodiment, the inventive concept provides an image sensor including; a substrate having a top surface and an opposing bottom surface, a trench formed in the top surface of the substrate, a transfer gate filling the trench, a first charge storage region formed in the substrate on a first side of the transfer gate, a second charge storage region formed in the substrate on a second side of the transfer gate, and a floating diffusion region exposed through the top surface of the substrate, wherein the transfer gate controls transfer of charge stored in the first charge storage region to the second charge storage region in response to a first voltage, and transfer of charge stored in the second storage region to the floating diffusion region in response to a second voltage different from the first voltage.

In another embodiment, the inventive concept provides an image sensor including; a sensor array including pixels that respectively convert an optical signal into a corresponding electrical output, and a timing generator controlling the sensor array, wherein each of the pixels includes a light-sensing element that generates charge in response to the optical signal, a storage diode formed in a substrate that stores the charge generated by the light-sensing element, a floating diffusion region formed in the substrate and spaced apart from the storage diode in a first direction, and a transfer gate buried in the substrate in the first direction, and the transfer gate controls the transfer of charge from the light-sensing element to the storage diode in response to a first transfer signal provided by the timing generator, and the transfer of charge from the storage diode to the floating diffusion region in response to a second transfer signal provided by the timing generator.

BRIEF DESCRIPTION OF THE DRAWINGS

The above and other embodiments and features of the inventive concept will become more apparent upon consideration of the description that follows together the attached drawings in which.

DETAILED DESCRIPTION

Image sensors according to embodiments of the inventive concept will hereinafter be described with reference to one or more of figures (FIGS. 1 through 14.

Figure 1:
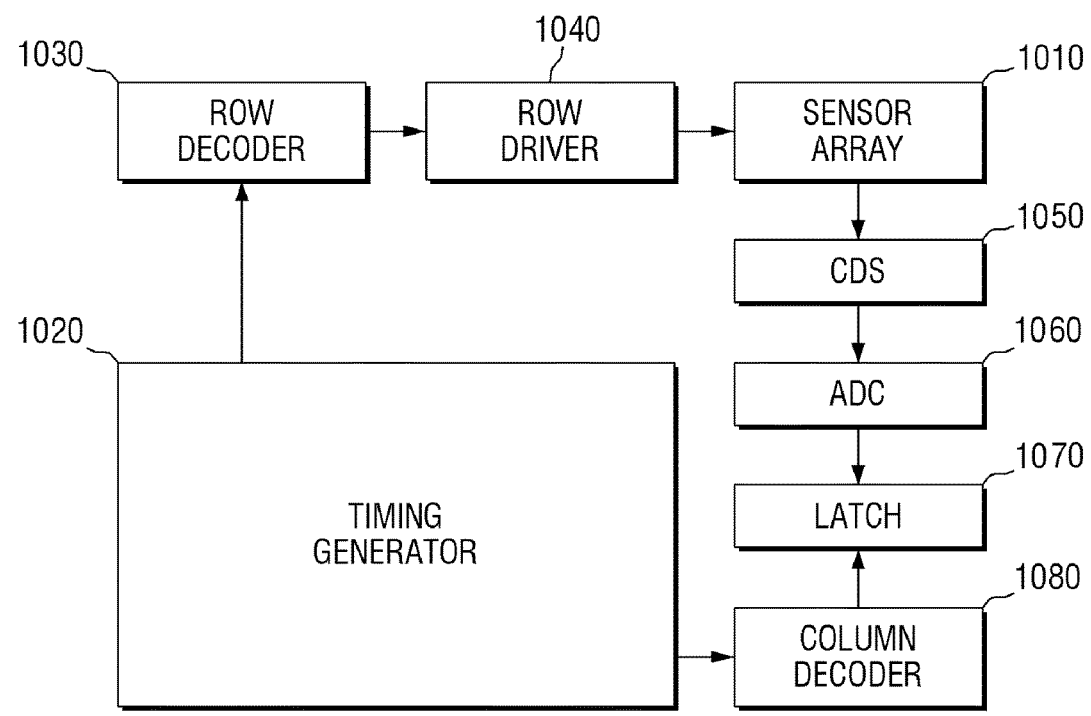
FIG. 1 is a block diagram of an image sensor according to certain embodiments of the inventive concept.

FIG. 1 is a block diagram of an image sensor according to embodiments of the inventive concept.

Referring to FIG. 1, the image sensor includes a sensor array 1010 of unit pixels, a timing generator 1020, a row decoder 1030, a row driver 1040, a correlated double sampler (CDS) 1050, an analog-to-digital converter (ADC) 1060, a latch 1070, and a column decoder 80.

The sensor array 1010 includes a plurality of unit pixels (hereafter, "pixels") that are arranged in a two-dimensional matrix. Each pixel converts selected electro-magnetic energy (hereafter, generically referred to as an "optical signal") into a corresponding electrical output. Thus, the array of pixels provides a corresponding plurality of electrical outputs. The sensor array 1010 is controlled (or driven) by one or more control signal(s) including, for example, first transfer signals (e.g., a row selection signal), a reset signal, and a charge transfer signal from the row driver 1040, etc. The electrical output provided by each pixel may be communicated to the CDS 1050 via a vertical signal line.

The timing generator 1020 provides one or more timing signal(s) and/or control signal(s) applied to the row decoder 1030 and/or the column decoder 80.

The row driver 1040 provides the first transfer signals that are used to drive respective pixels in response to a decoding result provided by the row decoder 1030 to the sensor array 1010. Assuming a case wherein the pixels are arranged in a matrix of rows and columns, the row driver 1040 may respectively provide the first transfer signals to corresponding rows of the matrix.

The CDS 1050 holds and samples electrical outputs provided by the sensor array 1010. That is, the CDS 1050 double-samples the level of noise, as well as the level of the electrical output(s) provided by the sensor array 1010, and outputs a corresponding analog signal (e.g., an analog signal equal to a difference between the noise level and electrical output level provided by the sensor array 1010).

The ADC 1060 then converts the analog signal provided by the CDS 1050 into a corresponding digital signal, and outputs the digital signal.

The latch 1070 latches the digital signal provided by the ADC 1060, wherein the latched digital signal is sequentially output to an image signal processor (not shown in FIG. 1) in response to a decoding result provided by the column decoder 80.

Figure 2:
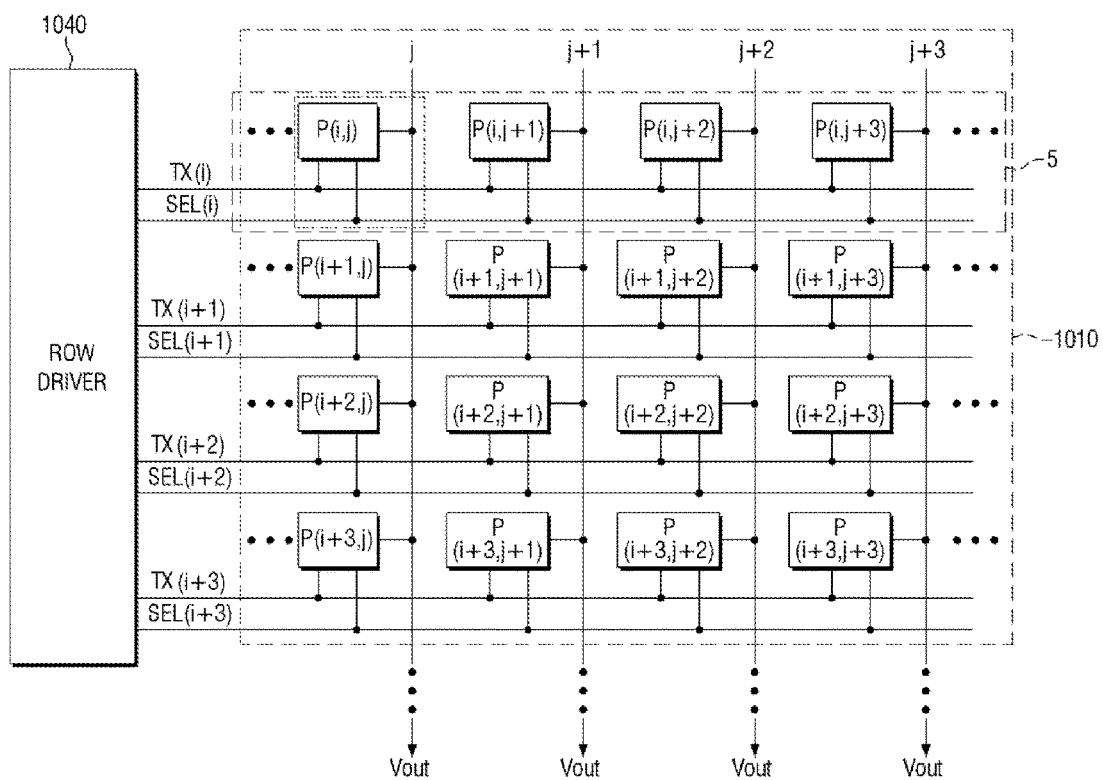
FIG. 2 is a block diagram further illustrating in one embodiment the sensor array of FIG. 1.

FIG. 2 is a block diagram further illustrating in one embodiment the sensor array of FIG.

Referring to FIG. 2, the sensor array 1010 includes a plurality of pixels, where each pixel (P) is a complementary metal-oxide semiconductor (CMOS) image pixel. Here, the plurality of pixels is arranged in a matrix including "i" rows and "j" columns, where i and j are positive integers.

The sensor array 1010 of FIG. 2 is capable of performing a global shutter operation. Thus, the sensor array 1010 further includes transmission lines TX and selection lines SEL, respectively connected to the pixels 1. More specifically, transmission lines TX(i) through TX(i+3) and selection lines SEL(i) through SEL(i+3) are respectively connected to the rows of pixels in the sensor array 1010.

The respective transmission lines TX(i) through TX(i+3) selection lines SEL(i) through SEL(i+3) may be used to provide each pixel of the sensor array 1010 with various control signal(s), along with the respective i row lines and j column lines. For example, assuming sensor array 1010 includes "N" by "M" pixels 1, where M and N are positive integers greater than 2, N transmission lines TX, N selection lines SEL, and M column lines j may be provided in the sensor array 1010. Although not illustrated in FIG. 2, N first reset lines RX1, N power supply lines VDD, and N second reset lines RX2 may also be provided in the sensor array 1010.

The sensor array 1010 may thus be understood as including N pixel sensor rows 5, where each pixel sensor row 5 includes multiple, row-adjacent pixels.

Row addressing and/or pixel row scanning functionality associated with the sensor array 1010 may be controlled by various control signal(s) communicated from the row driver 1040 via the transmission lines TX and selection lines SEL.

More specifically, the row driver 1040 may transmit first transfer signals and second transfer signals to each of the transmission lines TX and selection lines SEL, where the second transfer signal(s) may be communicated to the pixel sensor rows 5 in a non-sequential manner.

In certain embodiments, the first transfer signal may be used to transfer charge accumulated in a photodiode due to exposure to an optical signal to a storage diode. Then, the second transfer signal may be used to transfer the accumulated charge from the storage diode to a floating diffusion region. Thus, in a case wherein an image is captured using a global shutter mode, the first transfer signal may be simultaneously transmitted to all of the pixels 1 in the sensor array 1010, and then the second transfer signal may be sequentially transmitted to the respective rows of the sensor array 1010. That is, the first transfer signal is transmitted to each of the pixels 1 ahead of the second transfer signal.

However, in other embodiments, the image sensor may simultaneously transmit the first and second transfer signals through a transmission line TX. That is, charge is transferred from a photodiode to a storage diode by transmitting a first transfer signal having a first voltage through a transmission line TX, and then, the charge stored in the storage diode is transmitted to a floating diffusion region through the transmission line TX. This approach will be described hereafter in some additional detail.

Although not specifically shown in FIGS. 1 and 2, the pixels of the sensor array 1010 may be arranged in a Bayer pattern or a chess mosaic pattern. For example, in the case of employing the Bayer pattern, each of the pixels in the sensor array 1010 may be arranged to receive one of red light, green light, and blue light, but the inventive concept is not limited thereto. That is, the configuration of the pixels in the sensor array 1010 may vary.

In another example, each of the pixels in the sensor array 1010 may be arranged to receive two colors of light, i.e., red light and green light or blue light and green light. In this example, two light-sensing elements and their respective color filters may be stacked and arranged in each of the pixels.

In still another example, each of the pixels in the sensor array 1010 may be arranged to receive three colors of light. In this example, three light-sensing elements and their respective color filters may be stacked and arranged in each of the pixels such that each of the pixels can receive three colors of light (e.g., red, green, and blue light, respectively).

Figure 3:
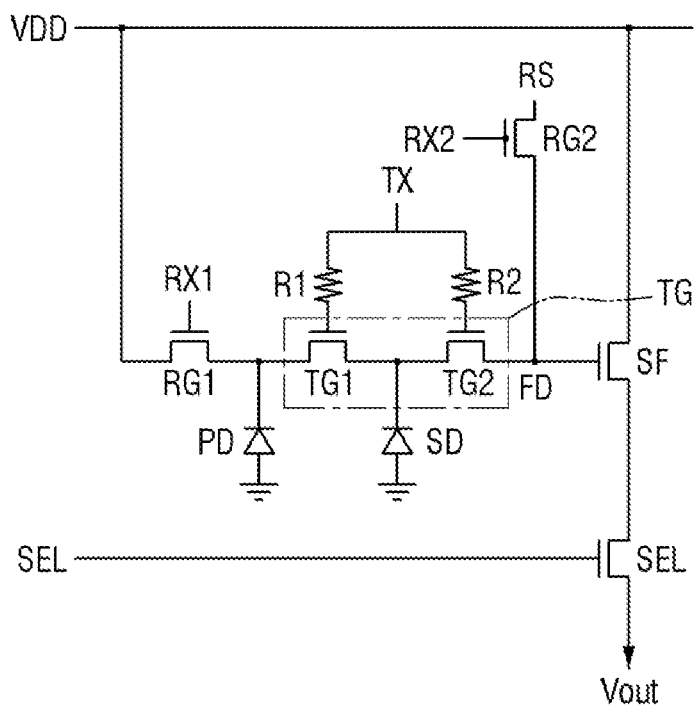
FIG. 3 is an equivalent circuit diagram of an image sensor that may be used in certain embodiments of the inventive concept.

FIG. 3 is an equivalent circuit diagram for an image sensor.

Referring to FIG. 3, the image sensor includes a photodiode PD, a storage diode SD, a first reset transistor RG1, a second reset transistor RG2, a transfer transistor TG, a source follower transistor SF, and a selection transistor SEL.

The photodiode PD, which is a light-sensing element that receives an external optical image, may generate photocharge (hereafter, "charge") that is proportional to an amount of incident light. FIG. 3 assumes the photodiode PD as an exemplary light receiving element, but the inventive concept is not limited thereto. That is, various types of light receiving elements other than the photodiode PD may also be used. The photodiode PD may be implemented as an element capable of sensing light external to a constituent substrate and generating and storing charge in a charge storage region in the substrate.

The photodiode PD is connected between the transfer transistor TG and a ground terminal GND, or alternately between the first reset transistor RG1 and the ground terminal GND.

The first reset transistor RG1 may be used to connect the photodiode PD to a power supply voltage VDD and thus to remove accumulated charge from the photodiode PD.

The transfer transistor TG may transfer charge among the photodiode PD, the storage diode SD, and a floating diffusion node FD (e.g., a node corresponding to a floating diffusion region of a constituent substrate) using first and second transfer signals.

Figure 4:
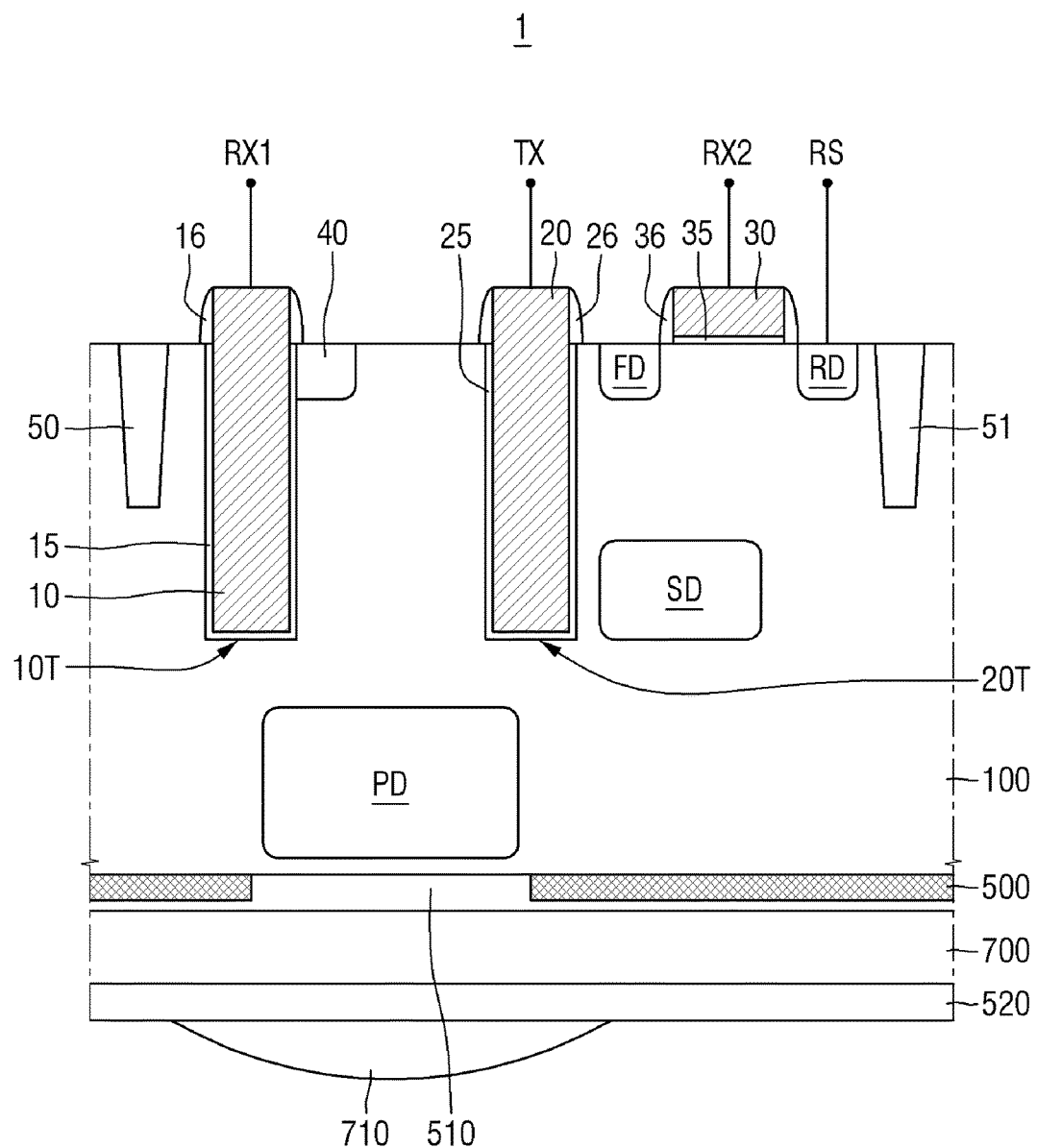
FIG. 4 is a cross-sectional diagram illustrating the image sensor of FIG. 3.

As further illustrated in the example of FIG. 4, the transfer transistor TG may include a vertical transfer gate 20, but by using first and second transfer signals having different voltages, the transfer transistor TG may operate as if it includes two transfer gates, i.e., first and second transfer gates TG1 and TG2.

That is, as illustrated in FIG. 3, the transfer gate TG may operate as if it includes the first transfer gate TG1, which transfers charge between the photodiode PD and the storage diode SD, and the second transfer transistor TG2, which transfers charge from the storage diode SD to the floating diffusion node FD. The transfer transistor TG will be described in some additional detail hereafter.

The storage diode SD may be used to temporarily store charge generated in the photodiode PD. FIG. 3 illustrates the storage diode SD as an exemplary light receiving element, but the inventive concept is not limited thereto. That is, various types of light receiving elements other than the storage diode SD may also be used. For example, a capacitor may be used instead of the storage diode SD.

The second reset transistor RG2 may be connected between a floating reset signal terminal RS, which provides a floating reset voltage V_h, and the floating diffusion node FD. The second reset transistor RG2 may connect the floating reset signal terminal RS and the floating diffusion node FD and may thus transfer the charge in the floating diffusion node FD to the floating reset signal terminal RS. That is, in response to the second reset transistor RG2 being turned ON by being provided with a reset signal through a second reset terminal RX2, the second reset transistor RG2 connects the floating reset signal terminal RS and the floating diffusion node FD. In response to the floating reset voltage V_h being transmitted to the floating diffusion node FD, the voltage of the floating diffusion node FD is reset to the floating reset voltage V_h.

The source follower transistor SF generates a source-drain current that is proportional to the amount of charge applied to the gate terminal of the source follower transistor SF. More specifically, a floating diffusion region voltage that is proportional to the amount of charge generated by the photodiode PD is generated in the floating diffusion node FD, and in response to the floating diffusion voltage being applied to the gate terminal of the source follower transistor SF, a source-drain current that is proportional to the amount of the charge generated by the photodiode PD may be generated.

To this end, the drain terminal of the source follower transistor SF is connected to the power supply voltage VDD, the source terminal of the source follower transistor SF is connected to the drain terminal of the selection transistor SEL, and the gate terminal of the source follower transistor SF is connected to the floating diffusion node FD, which is a common terminal for both the drain terminal of the transfer transistor TG and the source terminal of the reset transistor RX2.

The selection transistor SEL may transmit the current generated by the source follower transistor SF to a column line Vout. To this end, the drain terminal of the selection transistor SEL is connected to the source terminal of the source follower transistor SF, the source terminal of the selection transistor SEL is connected to the column line Vout, and the gate terminal of the selection transistor SEL is connected to a selection line SEL(i).

FIG. 4 is a cross-sectional diagram illustrating an image sensor according to an embodiment of the inventive concept.

Referring to FIG. 4, an image sensor 1 includes a substrate 100, a first reset gate 10, a transfer gate 20, a second reset gate 20, a photodiode PD, a storage diode SD, a floating diffusion region FD, a first reset drain 40, and a second reset drain RD.

The substrate 100 may be, for example, a bulk silicon substrate or a silicon-on-insulator (SOI) substrate. Alternatively, the substrate 100 may be a silicon substrate or may comprise a material other than silicon, such as, for example, silicon germanium, indium antimonide, a lead tellurium compound, indium arsenide, indium phosphide, gallium arsenide, or gallium antimonide. Still alternatively, the substrate 100 may be an epitaxial layer formed on a base substrate.

The substrate 100 has a first (or top) surface and a second (or bottom) surface, where the phrase "top surface of the substrate 100" is used to refer to the surface on which the first reset gate 10 and the transfer gate 20 are disposed, while the phrase "bottom surface of the substrate 100" is used to refer to a surface opposite that of the first or top surface (e.g., a surface most proximate to a shielding film 500, a color filter 700, and a micro-lens 710 etc.).

An active region may be defined in the substrate 100 by isolation films 50 and 51. The bottom surfaces of the isolation films 50 and 51 may be located lower than the top surface of the substrate 100 and may thus define the active region in the substrate 100. Each of the isolation films 50 and 51 may include any one of, for example, an oxide film, an oxynitride film, and a nitride film.

The transfer gate 20 may be formed in the substrate 100. More specifically, a transfer gate trench 20T may be formed in a depth direction of the substrate 100, and the transfer gate 20 may be formed to fill the transfer gate trench 20T. In some embodiments, the transfer gate 20 may correspond to the gate electrode of the transfer transistor TG of FIG. 3. In some embodiments, the transfer gate 20 may be a vertical transfer gate that is formed vertically through the top surface of the substrate 100.

A part of the transfer gate 20 may partially protrude over the substrate 100, and the rest of the transfer gate 20 may be buried in the substrate 100. More specifically, an upper part of the transfer gate 20 may protrude over the substrate 100, and a lower part of the transfer gate 20 may fill the transfer gate trench 20T.

The transfer gate 20 is illustrated in FIG. 4 as having a rectangular shape having the same upper and lower widths, but the inventive concept is not limited thereto. That is, alternatively, the transfer gate 20 may have a trapezoidal shape having a lower width narrower than an upper width thereof depending on the shape of the transfer gate trench 20T.

The transfer gate 20 may comprise, for example, a conductive material. Examples of the conductive material include doped polysilicon, titanium nitride (TiN), tantalum nitride (TaN), tungsten nitride (WN), titanium (Ti), tantalum (Ta), and tungsten (W), but the inventive concept is not limited thereto.

A transfer gate insulating film 25 may be formed to fill the transfer gate trench 20T. That is, the transfer gate insulating film 25 may be formed on the inside of the transfer gate trench 20T to be interposed between the substrate 100 and the transfer gate 20.

The transfer gate insulating film 25 may comprise, for example, a high-K material. The high-K material may include, for example, hafnium oxide, hafnium silicon oxide, lanthanum oxide, lanthanum aluminum oxide, or the like, but the inventive concept is not limited thereto. That is, alternatively, the transfer gate insulating film 25 may comprise a material such as a silicon oxide film, a silicon nitride film, or a silicon oxynitride film.

Transfer gate spacers 26 may be formed on both sides of the transfer gate 20. In some embodiments, the transfer gate spacers 26 may comprise a nitride film. The transfer gate spacers 26 may be formed on both sides of the transfer gate 20 to isolate the transfer gate 20.

A first reset gate 10 may be formed in the substrate 100. More specifically, a reset gate trench 10T may be formed in the depth direction of the substrate 100, and the first reset gate 10 may be formed to fill the reset gate trench 10T. In some embodiments, the first reset gate 10 may correspond to the gate electrode of the first reset transistor RG1 of FIG. 3.

A part of the first reset gate 10 may partially protrude over the substrate 100, and the rest of the first reset gate 10 may be buried in the substrate 100. More specifically, an upper part of the first reset gate 10 may protrude over the substrate 100, and a lower part of the first reset gate 10 may fill the reset gate trench 10T.

The first reset gate 10 is illustrated in FIG. 4 as having a rectangular shape having the same upper and lower widths, but the inventive concept is not limited thereto. That is, alternatively, the first reset gate 10 may have a trapezoidal shape having a lower width narrower than an upper width thereof depending on the shape of the reset gate trench 10T.

The first reset gate 10 may comprise, for example, a conductive material. Examples of the conductive material include doped polysilicon, TiN, TaN, WN, Ti, Ta, and W, but the inventive concept is not limited thereto.

A first reset gate insulating film 15 may be formed to fill the reset gate trench 10T. That is, the first reset gate insulating film 15 may be formed on the inside of the reset gate trench 10T to be interposed between the substrate 100 and the first reset gate 10. The first reset gate insulating film 15 may comprise the same material as the transfer gate insulating film 25.

A first reset drain 40 may be formed on a first side of the first reset gate 10. The first reset drain 40 is exposed through the top surface of the substrate 100. The first reset drain 40 may be connected to the power supply voltage VDD, and may connect the photodiode PD to the power supply voltage VDD to reset the photodiode PD according to a first reset signal RX1 applied to the first reset gate 10.

First reset gate spacers 16 may be formed to cover both sides of the first reset gate 10. In some embodiments, the first reset gate spacers 16 may comprise, for example, a nitride film. The transfer gate spacers 26 may be formed on both sides of the transfer gate 20 to isolate the transfer gate 20.

The photodiode PD may be formed "internal" (or substantially internal) to the substrate 100 (e.g., in a region proximate a second or bottom surface of the substrate). The photodiode PD may be formed by stacking a plurality of doped regions. A lower part of the photodiode PD may be formed by implanting n+ type ions, and an upper part of the photodiode PD may be formed by implanting n− type ions. The photodiode PD may function as a light-sensing element and may also function as a storage region for storing charge generated by sensing an optical signal.

In certain embodiments of the inventive concept, the photodiode PD is formed internal and proximate to the second (bottom) surface of the substrate 100. The second surface of the substrate 100 is at least partially covered with the shielding film 500, but a part of the second surface of the substrate 200 that overlaps with the photodiode PD may be exposed by the shielding film 500 in order to transmit an optical signal collected by the micro-lens 710 to the photodiode PD through the color filter 700.

The storage diode SD may be formed in the substrate 100. The storage diode SD may be formed by stacking a plurality of doped regions. A lower part of the storage diode SD may be formed by implanting n+ type ions, and an upper part of the storage diode SD may be formed by implanting n− type ions.

The photodiode PD and the storage diode SD may be formed on both sides, respectively, of the transfer gate 20. When the transfer transistor TG is driven by a first transfer signal provided through a transmission line TX connected to the transfer gate 20, a channel is formed between the photodiode PD and the storage diode SD, and the photodiode PD may provide the charge accumulated therein to the storage diode SD. That is, the photodiode PD may function as the source of the transfer transistor TG, and the storage diode SD may function as the drain of the transfer transistor TG.

In some embodiments, the transfer transistor TG may be an N-type transistor. A P-type conductive well may be defined in the substrate 100, and the photodiode PD and the storage diode SD may be formed in the P-type conductive well as N-type doped regions.

For a better understanding of the above, the transfer transistor TG is illustrated in FIG. 3 as including the first and second transfer transistors TG1 and TG2, and the photodiode PD and the storage diode SD are illustrated in FIG. 3 as being connected to the source terminal and the drain terminal, respectively, of the first transfer transistor TG1.

The storage diode SD may temporarily store charge provided by the photodiode PD and may transfer the stored charge to the floating diffusion region FD according to a second transfer signal provided by the transfer transistor TG. In some embodiments, the photodiode PD may be a first charge storage region, and the storage diode SD may be a second charge storage region.

The photodiode PD may be disposed closer than the storage diode SD to the second surface of the substrate 100 because the photodiode PD is supposed to receive an optical signal from the image sensor 1 and generate charge.

In the image sensor 1, the photodiode PD and the storage diode SD may not vertically overlap with each other because the photodiode PD needs to receive an optical signal through an opening formed by the shielding film 500 and the storage diode SD needs to be covered with the shielding film 500.

The floating diffusion region FD may be formed proximate the first transfer gate 20. The top surface of the floating diffusion region FD may be exposed through the top surface of the substrate 100. The transfer gate 20 may share the floating diffusion region FD with a second reset gate 30.

The storage diode SD and the floating diffusion region FD may be controlled by a second transfer signal provided to the transfer line TX connected to the transfer gate 20. More specifically, the storage diode SD, which temporarily stores the charge provided by the photodiode PD, may provide charge to the floating diffusion region FD according to the second transfer signal. Thus, a channel is formed between the storage diode SD and the floating diffusion region FD by the second transmission signal, the storage diode SD may function as the source of the transfer gate TG, and the floating diffusion region FD may functions as the drain of the transfer gate TG.

For a better understanding of the above, the photodiode PD and the storage diode SD are illustrated in FIG. 3 as being connected to the source terminal and the drain terminal, respectively, of the second transfer transistor TG2 of the transfer transistor TG.

In some embodiments, the floating diffusion region FD and the storage diode SD may at least partially overlap with each other vertically. That is, the floating diffusion region FD and the storage diode SD may be disposed side-by-side in a depth direction of the transfer gate 20.

The second reset gate 30 may be formed on the first surface of the substrate 100. If the first reset gate 10 and the transfer gate 20 are formed in the substrate 100 by filling the trenches 10T and 20T, which are formed in the depth direction of the substrate 100, the second reset gate 30 may be formed only on the substrate 100. That is, the lowest level of the second reset gate 30 may be higher than the top surface of the substrate 100.

The second reset gate 30 may comprise, for example, a conductive material. Examples of the conductive material include doped polysilicon, TiN, TaN, WN, Ti, Ta, and W, but the inventive concept is not limited thereto.

A second reset gate insulating film 35 may be formed between the second reset gate 30 and the first surface of the substrate 100. The second reset gate insulating film 35 may comprise, for example, a high-K material. The high-K material may include, for example, hafnium oxide, hafnium silicon oxide, lanthanum oxide, lanthanum aluminum oxide, or the like, but the inventive concept is not limited thereto. That is, alternatively, the second reset gate insulating film 35 may comprise a material such as a silicon oxide film, a silicon nitride film, or a silicon oxynitride film.

A second reset drain RD may be formed on a second side of the second reset gate 30. The second reset drain RD and the floating diffusion region FD may be formed on opposite sides of the second reset gate 30. The second reset drain RD may be connected to the floating reset terminal RS and may be provided with the floating reset voltage $V\_h$.

The shielding film 500, a lower planarization film 510, the color filter 700, an upper planarization film 520, and the micro-lens 710 may be formed on the second surface of the substrate 100.

The shielding film 500 may be formed to cover the second surface of the substrate 100. More specifically, the shielding film 500 may be formed to expose only the part of the second surface of the substrate 100 that overlaps with the photodiode PD and to cover the rest of the second surface of the substrate 100. The shielding film 500 may comprise, for example, a metal material.

The lower planarization film 510 covers the shielding film 500 and a part of the substrate 100, and the color filter 700 is formed on the lower planarization film 510. The upper planarization film 520 may be formed on the color filter 700 to planarize the surface where the micro-lens 710 is formed.

In some embodiments, the transfer of charge from the photodiode PD to the storage diode SD or from the storage diode SD to the floating diffusion region FD may be controlled by the transfer transistor TG. The provision of first and second transfer signals to the transfer gate 20 of the transfer transistor TG to transfer charge will hereinafter be described in detail.

Figure 5:
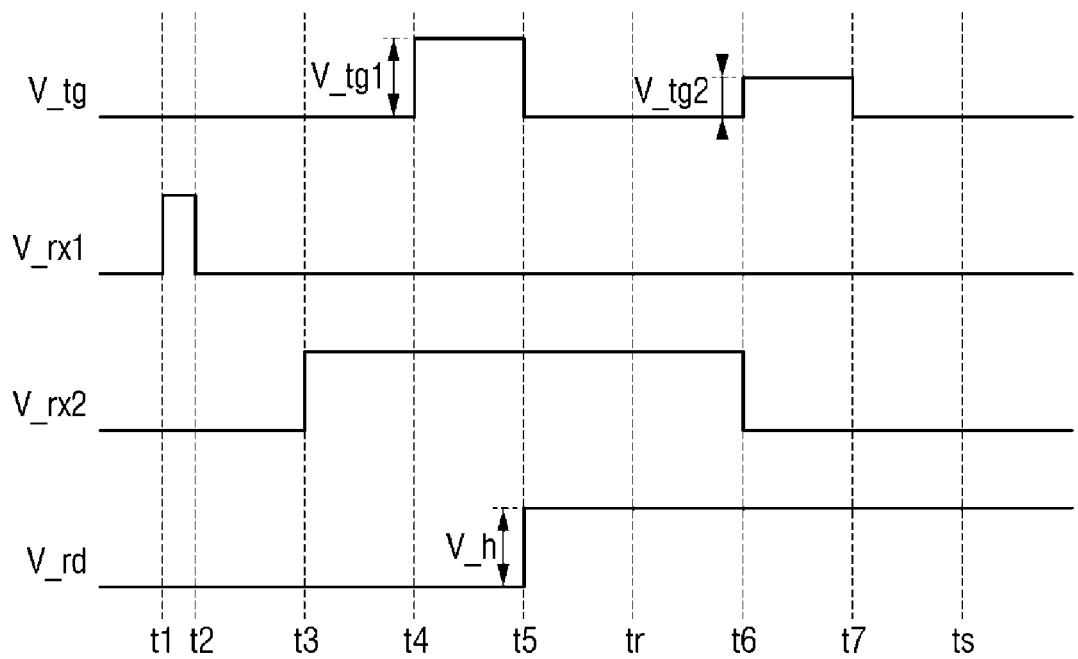
FIG. 5 is a timing diagram describing an exemplary operation of an image sensor according to some embodiments of the inventive concept.
Figure 6A:
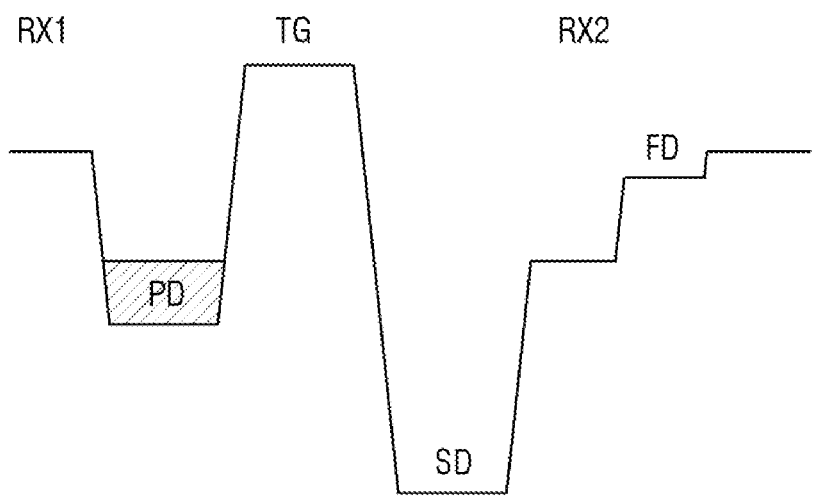
FIGS. 6A and 6B are diagrams illustrating an exemplary operation of the image sensor according to some embodiments of the inventive concept.
Figure 6B:
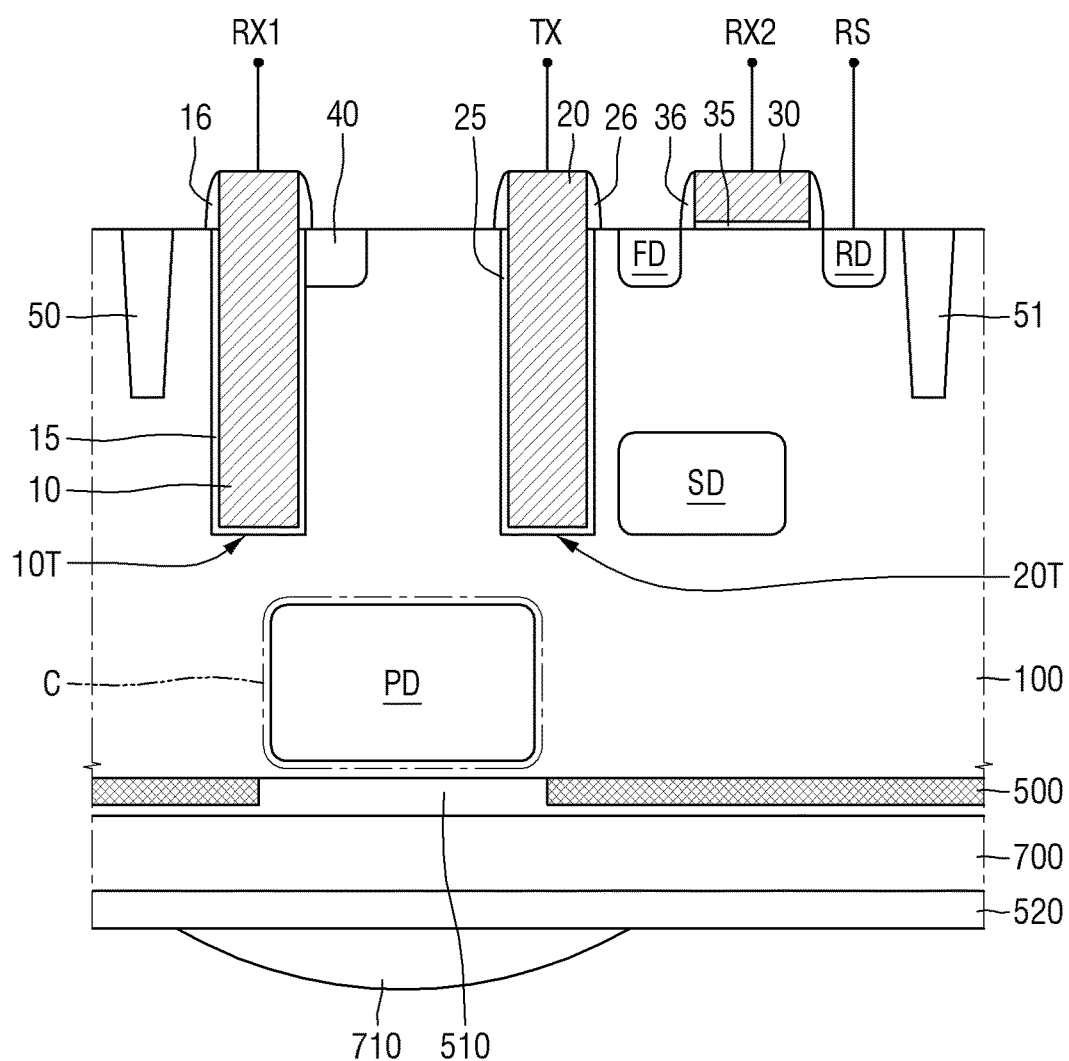

FIG. 5 is a timing diagram describing an exemplary operation of the image sensor of FIG. 4 according to certain embodiments of the inventive concept. FIGS. 6A and 6B are diagrams illustrating the exemplary operation of the image sensor of FIG. 4 according to some embodiments of the inventive concept.

Referring to FIG. 5, at time t1, a first reset signal $V\_rx1$ is provided to the first reset gate 10 through a first reset terminal RX1. The first reset signal $V\_rx1$ may turn on the first reset transistor RG1 and may reset the charge accumulated in the photodiode PD by connecting the photodiode PD to the power supply voltage VDD.

Thereafter, at time t2, the provision of the first reset signal $V\_rx1$ is terminated, and the accumulation of charge in the photodiode PD begins.

Referring to FIGS. 6A and 6B, the photodiode PD exposed by the shielding film 500 receives an optical signal, generates charge according to the amount of the optical signal, and temporarily stores the generated charge. FIG. 6A illustrates the transfer of charge during the driving of the image sensor 1. More specifically, FIG. 6A illustrates the accumulation of charge generated by the exposure of the photodiode PD in the photodiode PD. FIG. 6B illustrates that charge C is accumulated in the photodiode PD. At this time, no voltage is provided to the transfer gate 20, the second reset gate 30, and the second reset drain RD.

Referring again to FIG. 5, at time t3, a second reset signal $V\_rx2$ is applied to the second reset gate 30. Since the second reset signal $V\_rx2$ is applied to the second reset gate 30 but the floating reset voltage $V\_h$ is not applied to the floating reset terminal RS, the voltage of the floating diffusion region FD may be lowered. The voltage of the floating diffusion region FD may prevent charge from spilling into the floating diffusion region FD during the transfer of the charge from the photodiode PD to the storage diode SD.

Figure 7A:
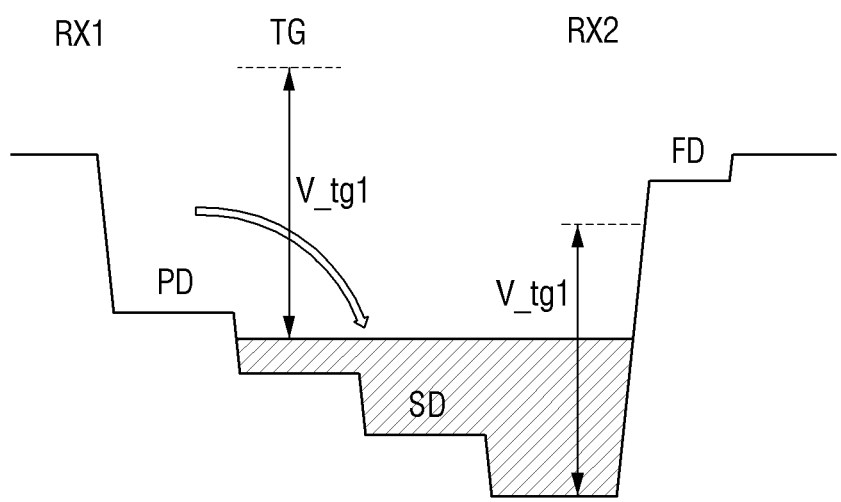
FIGS. 7A and 7B are diagrams illustrating an exemplary operation of the image sensor according to some embodiments of the inventive concept.
Figure 7B:
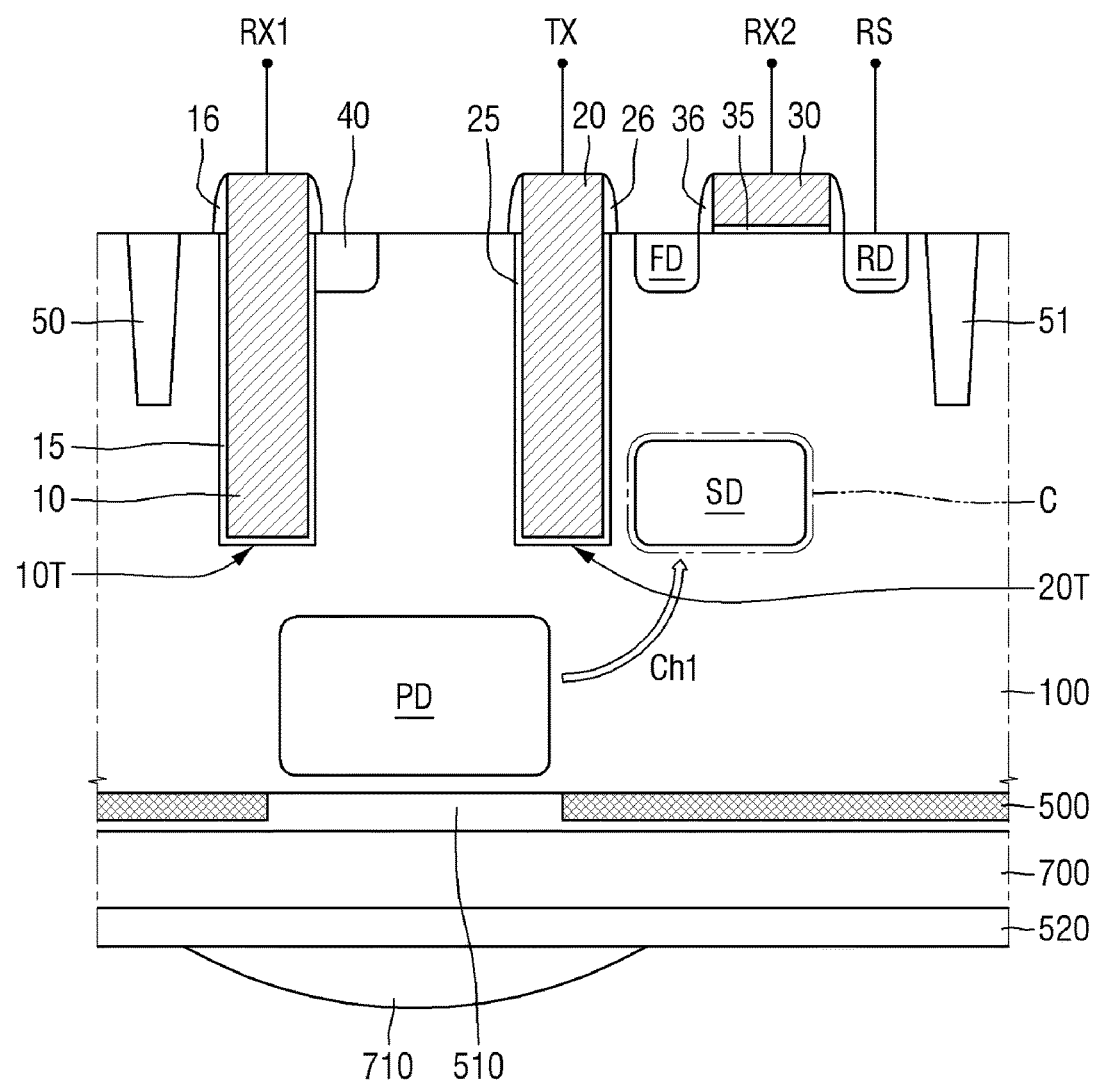

FIGS. 7A and 7B are diagrams illustrating the exemplary operation of the image sensor of FIG. 4 according to some embodiments of the inventive concept.

Referring to FIGS. 5, 7A, and 7B, at time t4, a first transfer signal is applied to the transfer gate 20. Since a driving signal such as the first transfer signal is applied to the transfer gate 20, the transfer gate TG may be turned ON. In some embodiments, the first transfer signal may have a first voltage $V\_tg1$.

In response to the transfer gate TG being turned ON, a first channel Ch1 is formed between the photodiode PD and the storage diode SD. The charge C accumulated in the photodiode PD may be transferred to, and accumulated in, the storage diode SD through the first channel Ch1.

At time t3, the voltage of the floating diffusion region FD is maintained to be low, and thus, no channel is formed between the storage diode SD and the floating diffusion region FD. Accordingly, at time t4, the charge C accumulated in the storage diode SD may not be transferred to the floating diffusion region FD.

More specifically, referring again to FIG. 3, a channel is formed between the photodiode PD and the storage diode SD, among other elements connected to the transfer transistor TG, the first transfer transistor TG1 is turned ON, and the second transfer transistor TG2 is maintained to be turned OFF. Accordingly, at time t4, charge is transferred from the photodiode PD to the storage diode SD, but not from the storage diode SD to the floating diffusion region FD.

Thereafter, at time t5, the floating reset voltage $V\_h$ is applied to the second reset drain RD through the reset terminal RS, and this will hereinafter be described with reference to FIG. 8.

Figure 8:
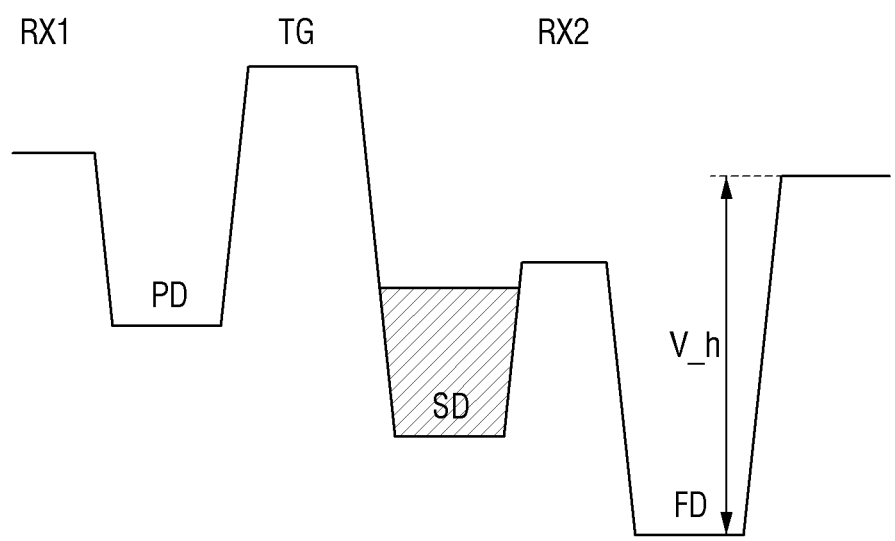
FIG. 8 is a diagram illustrating an exemplary operation of the image sensor according to some embodiments of the inventive concept.

FIG. 8 is a diagram illustrating the exemplary operation of the image sensor of FIG. 4 according to some embodiments of the inventive concept.

Referring to FIG. 8, the provision of the first transfer signal having the first voltage V_tg1 is terminated, and the transfer of charge between the photodiode PD and the storage diode SD is terminated.

Since the floating reset voltage V_h is provided to the second reset drain RD, the voltage of the floating diffusion region FD may be raised, and the charge in the floating diffusion region FD may be reset. The image sensor 1 may generate an image signal using the difference between the voltage of the floating diffusion region FD when the floating diffusion region FD is not charged and the voltage of the floating diffusion region FD when the floating diffusion region FD is charged. Thus, the image sensor 1 may read the voltage of the floating diffusion region FD when the floating diffusion region FD is yet to be charged.

Thereafter, at time tr, the voltage of the reset floating diffusion region FD may be read.

In some embodiments, the floating reset voltage V_h may be higher than the voltage of the first transfer signal, i.e., the first voltage V_tg1.

Figure 9A:
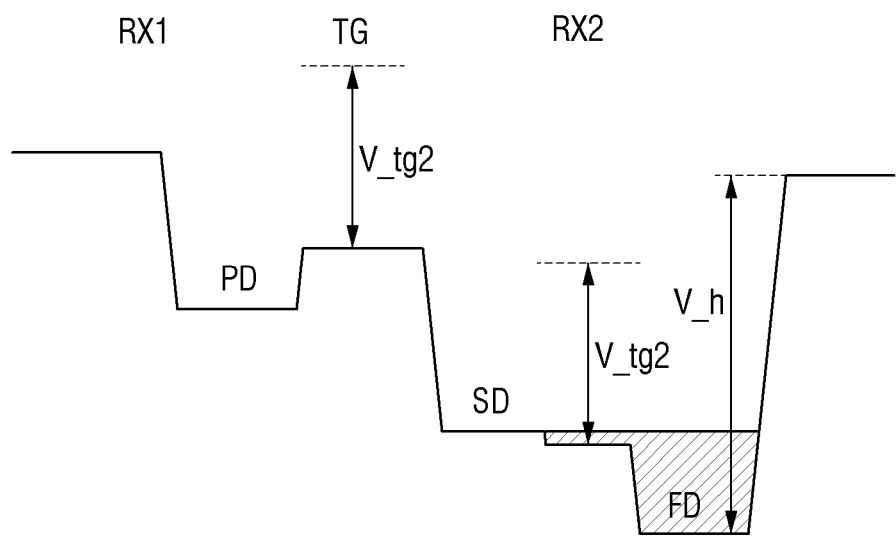
FIGS. 9A and 9B are diagrams illustrating an exemplary operation of the image sensor according to some embodiments of the inventive concept.
Figure 9B:
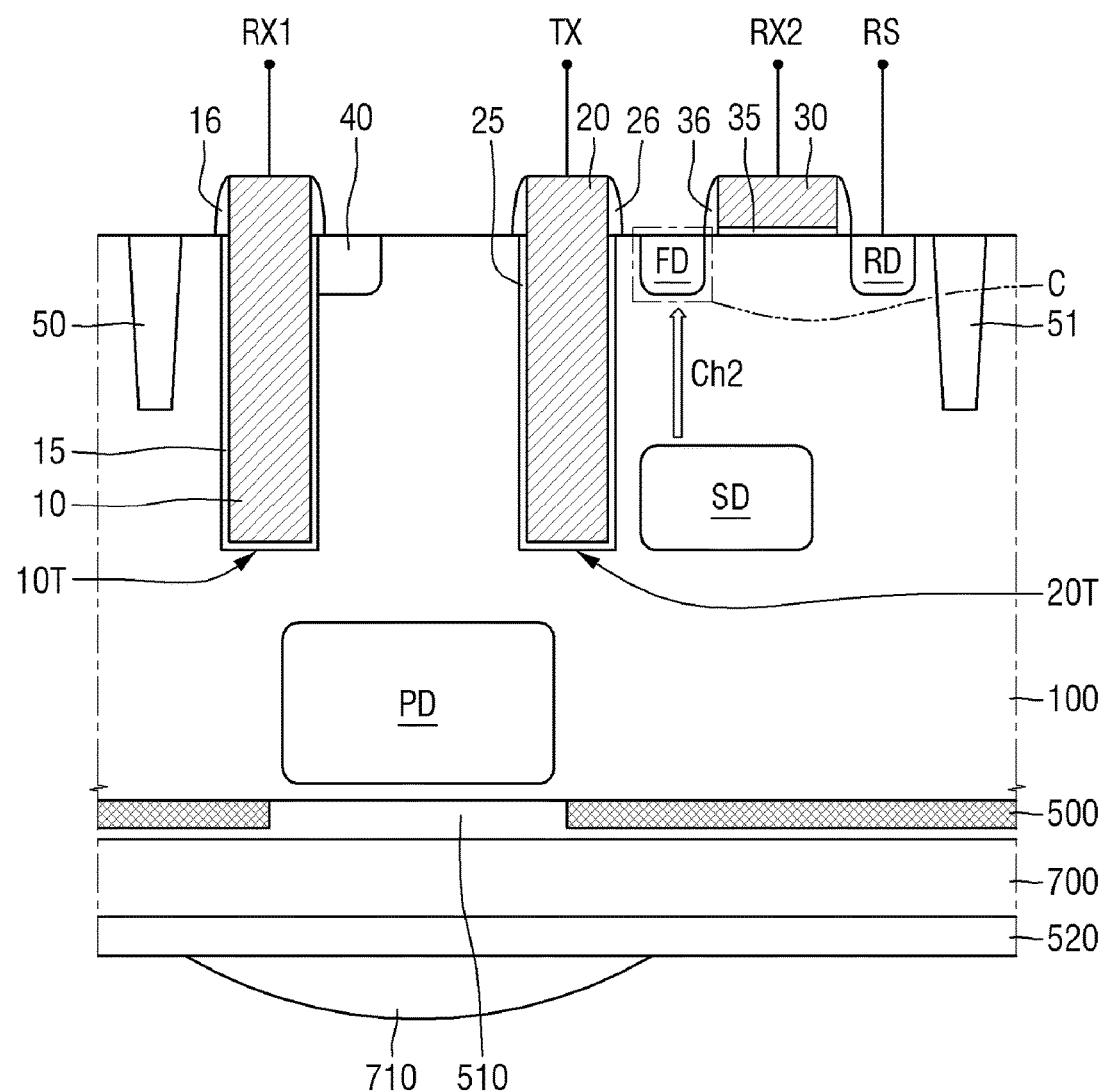

FIGS. 9A and 9B are diagrams illustrating the exemplary operation of the image sensor of FIG. 4 according to some embodiments of the inventive concept.

Referring to FIGS. 5, 9A, and 9B, at time t6, a second transfer signal is provided to the transfer gate 20 of the transfer transistor TG. At the same time, the provision of the second transfer signal V_rx2 is terminated, and the second reset transistor RG is turned OFF. In some embodiments, the second transfer signal may have a second voltage V_tg2.

Since the second transfer signal is provided to the transfer gate 20, the transfer transistor TG may be turned ON again. The transfer transistor TG may be turned ON to form a second channel Ch2 between the storage diode SD and the floating diffusion region FD. The charge C accumulated in the storage diode SD may be transferred to the floating diffusion region FD through the second channel Ch2, and the charge C may be charged into the floating diffusion region FD.

More specifically, referring again to FIG. 3, a channel is formed between the storage diode SD and the floating diffusion region FD, among other elements connected to the transfer transistor TG, the first transfer transistor TG1 is turned OFF, and the second transfer transistor TG2 is turned ON. Accordingly, at time t6, charge is transferred from the storage diode SD to the floating diffusion region FD, but not from the storage diode SD to the photodiode PD.

In some embodiments, the voltage of the first transfer signal for transferring charge from the photodiode PD to the storage diode SD and the voltage of the second transfer signal for transferring charge from the storage diode SD to the floating diffusion region FD may differ from each other. That is, the first voltage V_tg1 and the second voltage V_tg2 may differ from each other. More specifically, the second voltage V_tg2 may be lower than the first voltage V_tg1.

Thereafter, at time t7, the provision of the second transfer signal is terminated, and the transfer of charge from the storage diode SD to the floating diffusion region FD is terminated. Then, at time ts, the voltage of the floating diffusion region FD having the charge C accumulated therein is read. The CDS 1050 samples the voltage of the floating diffusion region FD using the difference between the voltage of the floating diffusion region FD read at time tr and the voltage of the floating diffusion region FD read at time ts.

As described above, the image sensor 1 includes a single transfer gate 20, which controls the transfer of charge among the photodiode PD, the storage diode SD, and the floating diffusion region FD that are all formed in the substrate 100. The transfer gate 20 is formed to fill the trench 20T, which is formed in the depth direction of the substrate 100, and may be located adjacent to all the photodiode PD, the storage diode SD, and the floating diffusion region FD.

The transfer gate 20 is provided with first and second transfer signals having different voltages, i.e., the first and second voltages V_tg1 and V_tg2, and as a result, channels may be formed separately between the photodiode PD and the storage diode SD and between the storage diode SD and the floating diffusion region FD.

Accordingly, since the image sensor 1 does not need a separate gate for forming a channel between the storage diode SD and the floating diffusion region FD, the area, on the substrate 100, occupied by the image sensor 1 can be reduced, which is advantageous for integration.

Figure 10:
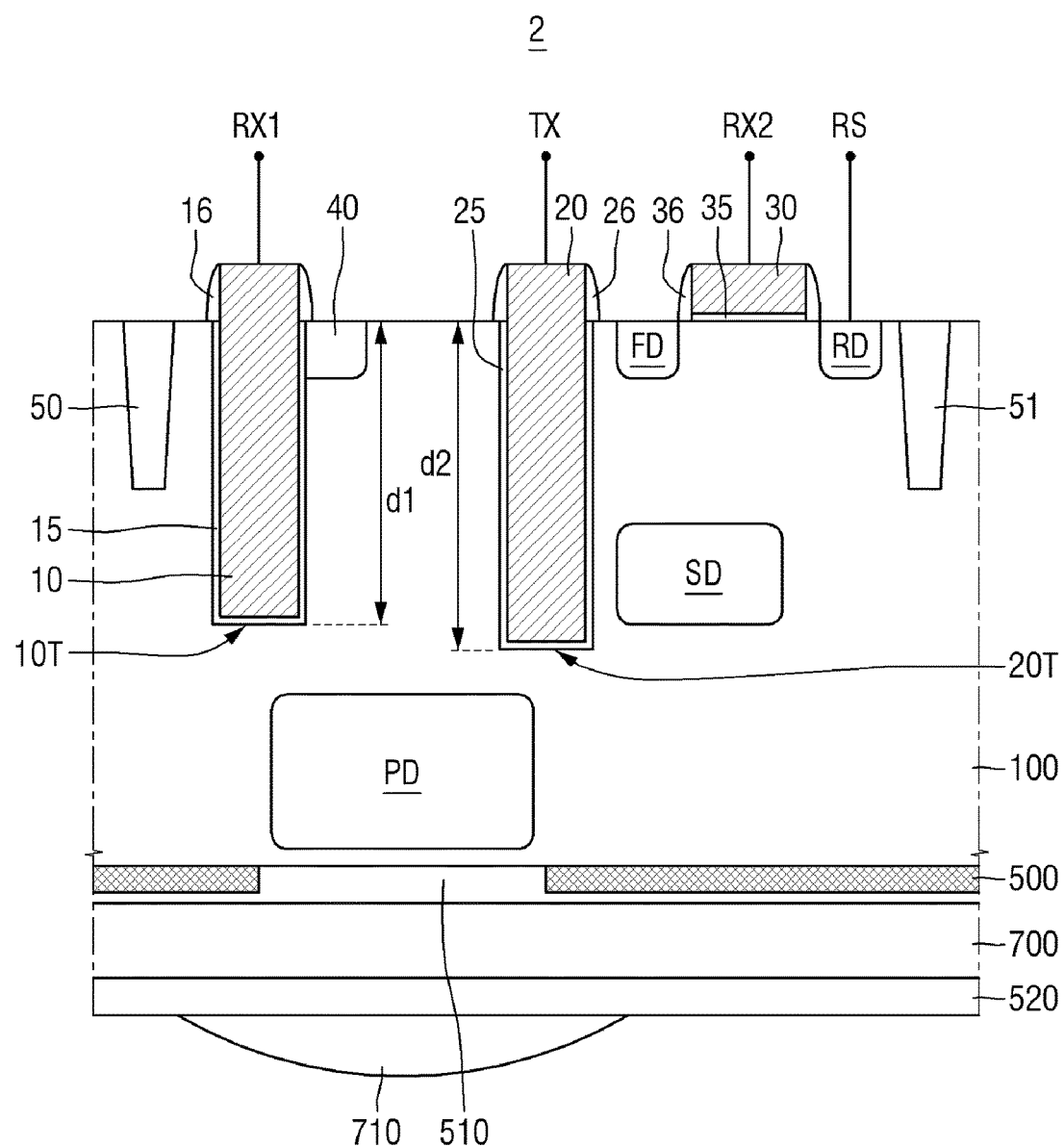
FIG. 10 is a diagram illustrating an image sensor according to another embodiment of the inventive concept.

FIG. 10 is a diagram illustrating an image sensor according to another embodiment of the inventive concept. An image sensor 2 of FIG. 10 will hereinafter be described, focusing mainly on differences with the image sensor 1 of FIG. 4.

Referring to FIG. 10, a depth d1 of a first reset gate 10 in a depth direction of a substrate 100 may differ from a depth d2 of a transfer gate 20 in the depth direction of the substrate 100. More specifically, the depth d1 of the first reset gate 10 may be smaller than the depth d2 of the transfer gate 20. In this case, the first reset gate 10 may completely overlap with a photodiode PD vertically.

Figure 11:
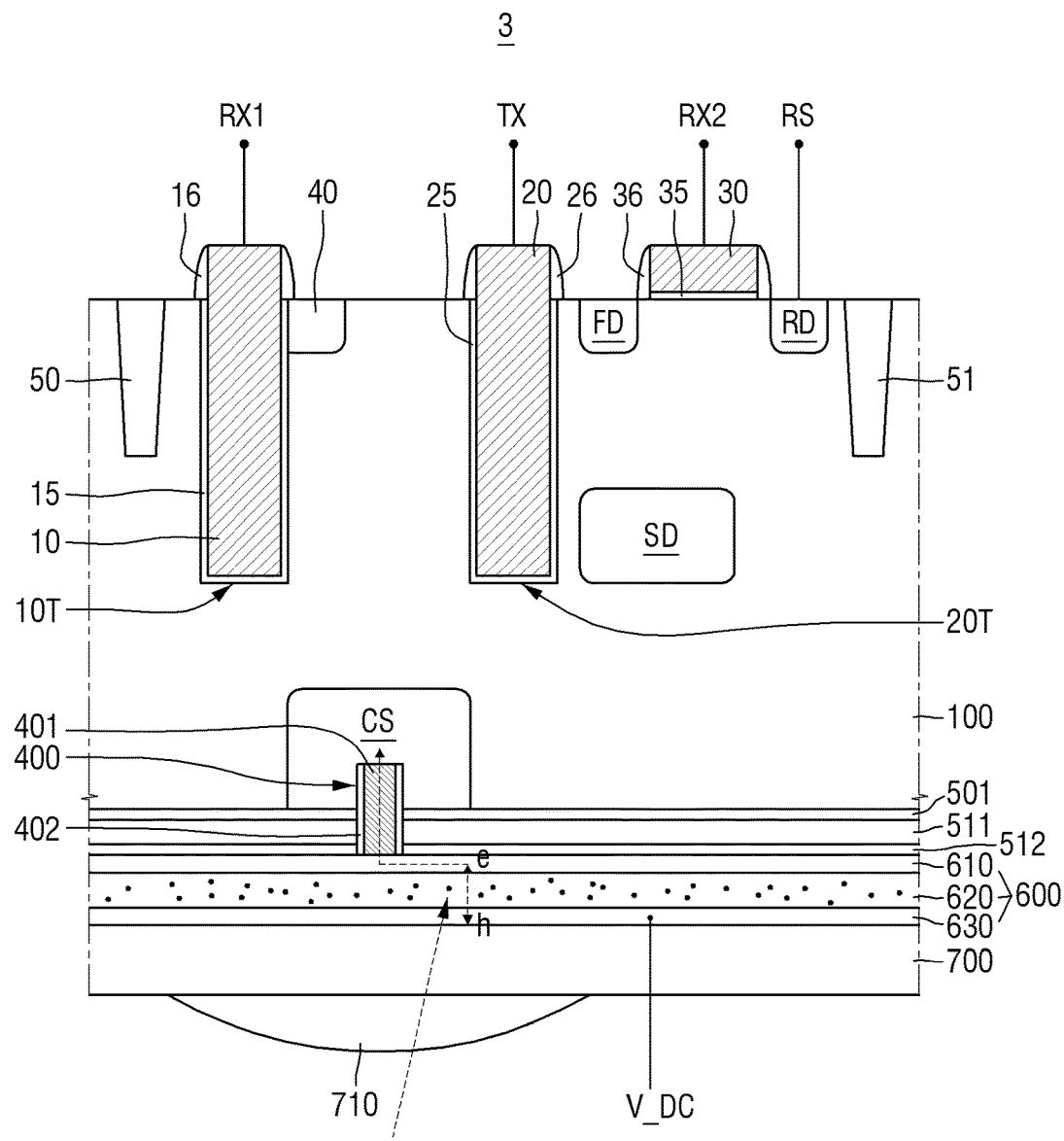
FIG. 11 is a diagram illustrating an image sensor according to another embodiment of the inventive concept.

FIG. 11 is a diagram illustrating an image sensor according to another embodiment of the inventive concept. An image sensor 3 of FIG. 11 will hereinafter be described, focusing mainly on differences with the image sensors 1 and 2 of FIGS. 4 and 10.

Referring to FIG. 11, the image sensor 3 may include a different type of light-sensing element from the image sensor 1 of FIG. 4.

More specifically, the image sensor 3 may include an external light-sensing element 600, which is formed external to a second (or a bottom) surface of a substrate 100, instead of the photodiode PD of FIG. 4, which is formed on the inside of the substrate 100.

The external light-sensing element 600 may be formed on a second surface of the substrate 100 and may include two electrodes, i.e., a lower electrode 610 and an upper electrode 630, and a charge generation layer 620, which is formed between the lower electrode 610 and the upper electrode 630. An optical signal L, which is collected by a micro-lens 700 and passes through a color filter 630, may be provided to the charge generation layer 620 and may thus cause charge to be generated.

In some embodiments, a direct current (DC) voltage V_DC may be applied to the upper electrode 630, and a higher voltage than the DC voltage V_DC may be applied to the lower electrode 610. Accordingly, if pairs of electrons e and holes h are generated in the charge generation layer 620 by the optical signal L provided to the charge generation layer 620, the electrons e may be provided to the lower electrode 610, and the holes h may be provided to the upper electrode 630.

The charge generation layer 620 may be, for example, a film comprising an organic material, but the inventive concept is not limited thereto. That is, alternatively, the charge generation layer 620 may comprise an inorganic material.

In some embodiments, the lower electrode 610 and the upper electrode 630 may have different configurations. More specifically, the upper electrode 630 may be transparent, but the lower electrode 610 may be opaque, in which case, the upper electrode 630 may transmit the optical signal L therethrough, but the lower electrode 610 may not transmit the optical signal L therethrough.

The electrons e provided to the lower electrode 610 may be provided to a charge storage region CS through a via 402. The charge storage region CS may be a region formed in the substrate 100 to be adjacent to the second surface of the substrate 100. The charge storage region CS may be formed by implanting n+ type ions into the substrate 100.

The via 402 may be formed of a conductive material to fill a via hole 400, which is formed to penetrate the lower planarization layer 501, a shielding film 511, and the upper planarization layer 512. More specifically, the inner wall of the via hole 400 is covered by an insulating film 402, and the via 402 may fill the inner space of the via hole 400 defined by the insulating film 402.

The exposure of the external light-sensing element 600 may be initiated by a first reset signal RX1 applied to a first reset gate 10. Charge (i.e., electrons) generated by the exposure of the external light-sensing element 600 may be temporarily stored in the charge storage region CS through the via 402.

Thereafter, as already mentioned above with regard to the previous embodiments, charge is transferred to a storage diode SD and a floating diffusion region FD using a first transfer signal having a first voltage level $V\_tg1$ and a second transfer signal having a second voltage level $V\_tg2$.

Meanwhile, the shielding film 511 may be formed to surround the via hole 400. That is, the shielding film 511 may cover the entire second surface of the substrate 100, and only the via hole 400 may be connected to the charge storage region CS through the shielding film 511.

Figure 12:
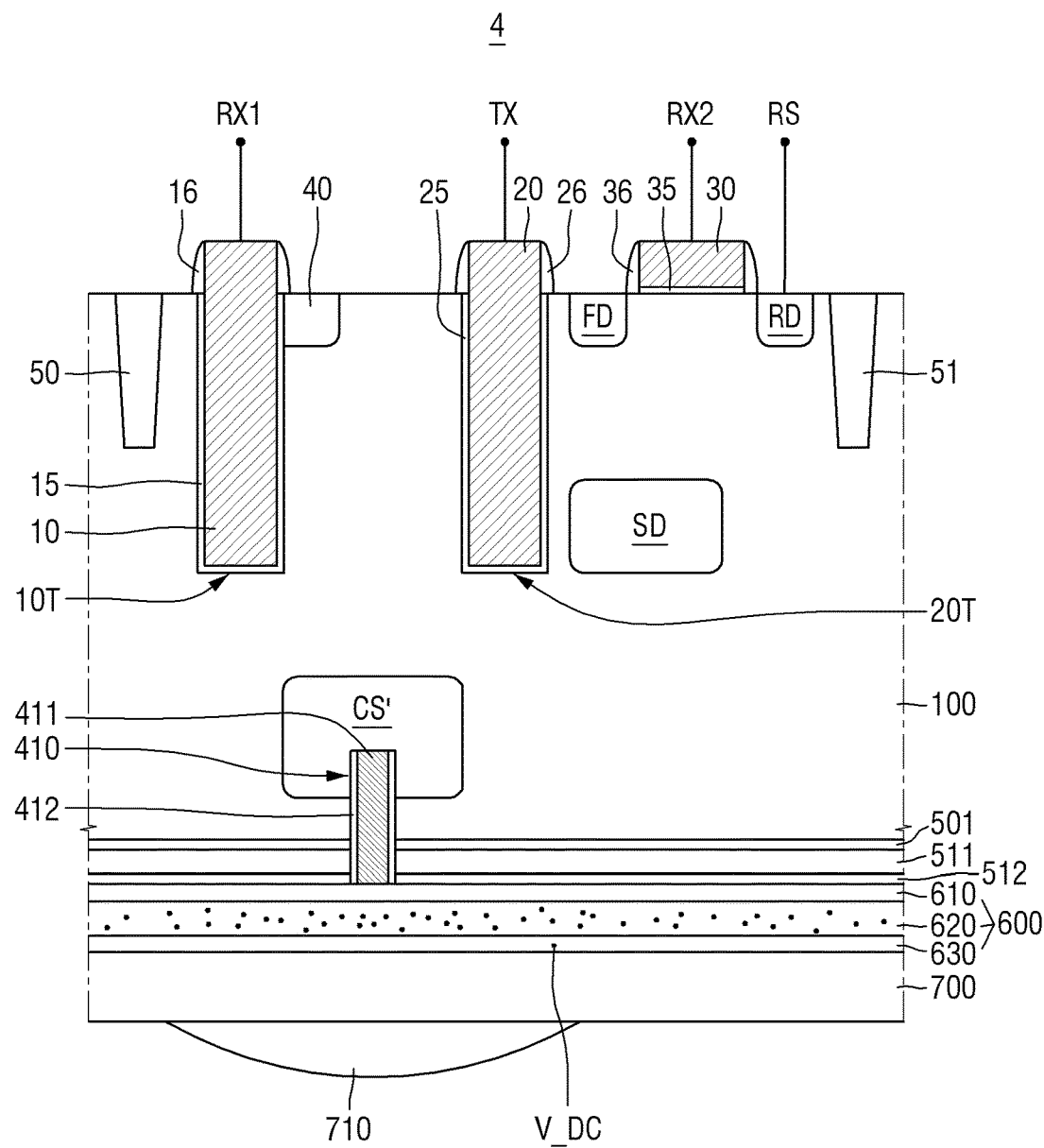
FIG. 12 is a diagram illustrating an image sensor according to another embodiment of the inventive concept.

FIG. 12 is a diagram illustrating an image sensor according to another embodiment of the inventive concept. An image sensor 4 of FIG. 12 will hereinafter be described, focusing mainly on differences with the image sensors 1, 2, and 3 of FIGS. 4, 10, and 11.

Referring to FIG. 12, a charge storage region CS' may have a different shape from the charge storage region CS of FIG. 11. More specifically, the charge storage region CS' may be formed to be spaced apart from a second surface of a substrate 100. Accordingly, the charge storage region CS' may be buried in the substrate 100.

A via 411 may electrically connect the charge storage region CS', which is spaced apart from the second surface of the substrate 100, and a lower electrode 610. The via 411 and the sidewall of a via hole 410, which is filled with an insulating film 412, may be surrounded by the substrate 100, the charge storage region CS', and a shielding film 511.

Figure 13:
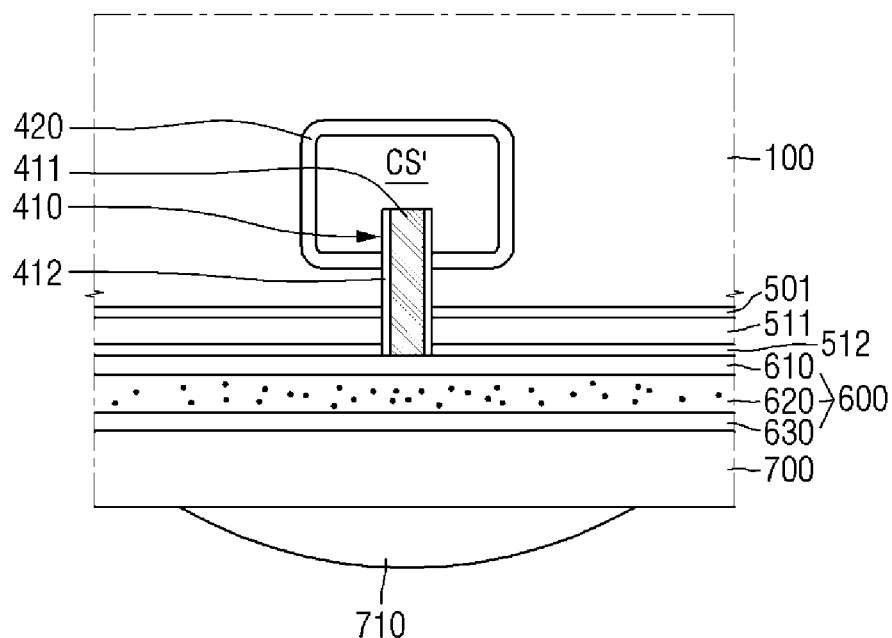
FIG. 13 is a diagram illustrating an image sensor according to another embodiment of the inventive concept.

FIG. 13 is a diagram illustrating an image sensor according to another embodiment of the inventive concept. An image sensor 4a of FIG. 13 will hereinafter be described, focusing mainly on differences with the image sensors 1, 2, 3, and 4 of FIGS. 4, 10, 11, and 12.

Referring to FIG. 13, the image sensor 4a may further include a doped region 420, which surrounds a charge storage region CS'. The doped region 420 may be formed in a substrate 100 to surround the charge storage region CS'. In some embodiments, the doped region 420 may be doped with ions of a different conductivity type from the charge storage region CS'. For example, in a case in which the charge storage region CS' is doped with n+ type ions, the doped region 420 may be doped with P type ions.

A via 411 may penetrate the doped region 420, which surrounds the charge storage region CS', and may electrically connect a lower electrode 610 and the charge storage region CS'.

Figure 14:
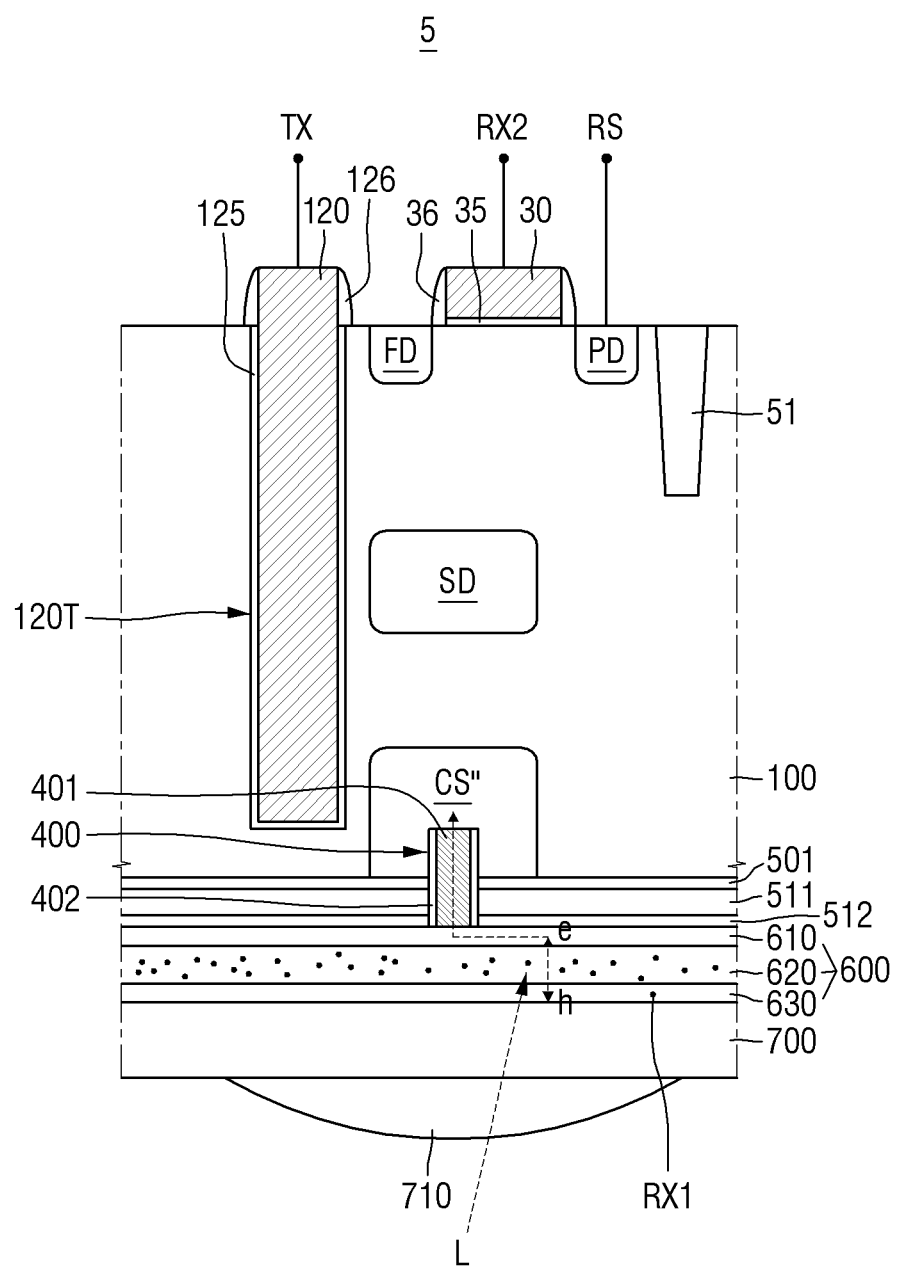
FIG. 14 is a diagram illustrating an image sensor according to another embodiment of the inventive concept.

FIG. 14 is a diagram illustrating an image sensor according to another embodiment of the inventive concept.

Referring to FIG. 14, an image sensor 5 may have a different structure from the image sensors 1, 2, 3, 4, and 4a.

More specifically, the image sensor 5, unlike in the image sensors 1, 2, 3, 4, and 4a, may not include a first reset gate 10. That is, the image sensor 5 may include a transfer gate 120, which is formed in a depth direction of a substrate 100, a second reset gate 30, and a charge storage region CS", a storage diode SD, and a floating diffusion region FD, which are formed to be vertically aligned with one another along the depth direction of the substrate 100.

The charge storage region CS" and an external light-sensing element 600 of the image sensor 5 may have similar structures to their respective counterparts of the image sensor 3 of FIG. 11, except that in the image sensor 5, the charge storage region CS" and a storage diode SD are formed on the same side of a transfer gate 120, whereas in the image sensor 3, the charge storage region CS and the storage diode SD are formed on opposite sides of the transfer gate 20. Accordingly, the charge storage region CS" and the storage diode SD of the image sensor 5 may be vertically aligned.

The image sensor 5 may be connected to a first reset terminal RX1 through an upper electrode 630. That is, the upper electrode 630 may receive a first reset signal $V\_rx1$ from the first reset terminal RX1. The external light-sensing element 600 may receive the first reset signal $V\_rx1$ and may generate charge in a charge generation layer 620 and may transfer the charge to the charge storage region CS". At this time, since no additional signal is applied to the transfer gate 120, no charge is transferred from the charge storage region CS" to the storage diode SD.

Thereafter, as already mentioned above with regard to the previous embodiments, charge is transferred from the charge storage region CS" to the storage diode SD and from the storage diode SD to the floating diffusion region FD. More specifically, the transfer gate 120 transmits the charge accumulated in the charge storage region CS" to the storage diode SD using a first transfer signal having a first voltage level $V\_tg1$. At this time, as already mentioned above with regard to the previous embodiments, a second reset signal $V\_rx2$ is applied to a second reset gate RG2 to prevent charge from being transferred from the storage diode SD to the floating diffusion region FD.

Thereafter, the floating diffusion region FD is reset, and the voltage of the reset floating diffusion region FD is read. Then, the transfer gate 120 transfers charge from the storage diode SD to the floating diffusion region FD using a second transfer signal having a second voltage $V\_tg2$. At this time, a floating reset voltage $V\_h$ is continuously applied to a second reset drain RD.

Certain embodiments of the inventive concept have been described with reference to the attached drawings, but it may be understood by one of ordinary skill in the art that the inventive concept may be performed one of ordinary skill in the art in other specific forms without changing the technical concept or essential features of the inventive concept. The scope of the inventive concept is defined by the following claims and their equivalents.

What is claimed is:

1. An image sensor, comprising:
    a light-sensing element that generates charge in response to incident light;
    a storage diode formed in a substrate, wherein the storage diode stores the charge generated by the light-sensing element;

a floating diffusion region formed in a top surface of the substrate and spaced apart from the storage diode;

a transfer gate at least partially buried under the top surface of the substrate, wherein the transfer gate controls both the transfer of the charge from the light-sensing element to the storage diode, and the transfer of the charge from the storage diode to the floating diffusion region.

2. The image sensor of claim 1, further comprising a first channel region adjacent a first surface portion of the transfer gate for transferring the charge from the light-sensing element to the storage diode, and a second channel region adjacent a second surface portion of the transfer gate for transferring the charge from the storage diode to the floating diffusion region.

3. The image sensor of claim 1, wherein the transfer gate controls the transfer of the charge from the light-sensing element to the storage diode in response to a first transfer signal having a first voltage, and the transfer of the charge from the storage diode to the floating diffusion region in response to a second transfer signal having a second voltage different from the first voltage.

4. The image sensor of claim 3, wherein the first voltage is higher than the second voltage.

5. The image sensor of claim 1, wherein the light-sensing element comprises a photodiode formed internal to the substrate and proximate a bottom surface of the substrate.

6. The image sensor of claim 1, wherein the light-sensing element comprises an external light-sensing element formed at least partially external to the substrate and proximate a bottom surface of the substrate.

7. The image sensor of claim 6, wherein the external light-sensing element comprises:
a first electrode formed on the bottom surface of the substrate;
a second electrode formed on the first electrode; and
a charge generation layer formed between the first electrode and the second electrode.

8. The image sensor of claim 6, further comprising:
charge storage region formed in the bottom surface of the substrate, wherein the light-sensing element is electrically connected to the charge storage region through a via.

9. The image sensor of claim 8, wherein charge generated by the light-sensing element is stored in the charge storage region, and the transfer gate controls the transfer of the charge stored in the charge storage region to the storage diode.

10. The image sensor of claim 8, wherein the charge storage region, the storage diode, and the floating diffusion region are vertically aligned in relation to the horizontally disposed top and bottom surfaces of the substrate.

11. The image sensor of claim 1, further comprising:
a first reset gate spaced apart from the transfer gate and at least partially buried in the top surface of the substrate, wherein the first reset gate resets the light-sensing element in response to a first reset signal.

12. The image sensor of claim 11, further comprising:
a second reset gate formed in the top surface of the substrate, wherein the second reset gate and the transfer gate are disposed on opposite sides of the floating diffusion region.

13. The image sensor of claim 12, wherein the second reset gate comprises a reset drain, such that the floating diffusion region is reset by a floating reset voltage applied to the reset drain.

14. An image sensor, comprising:
a substrate having a top surface and an opposing bottom surface;
a trench formed in the top surface of the substrate;
a transfer gate filling the trench;
a first charge storage region formed in the substrate on a first side of the transfer gate;
a second charge storage region formed in the substrate on a second side of the transfer gate; and
a floating diffusion region exposed through the top surface of the substrate,
wherein the transfer gate controls transfer of charge stored in the first charge storage region to the second charge storage region in response to a first voltage, and transfer of charge stored in the second storage region to the floating diffusion region in response to a second voltage different from the first voltage.

15. The image sensor of claim 14, further comprising:
an external light-sensing element disposed on the bottom surface of the substrate, wherein the first charge storage region is electrically connected to the external light-sensing element, such that the first charge storage region receives and stores charge generated in response to an optical signal received by the light-sensing element.

16. The image sensor of claim 15, further comprising:
a region surrounding the first charge storage region and doped with ions of a different conductivity type than ions of the first charge storage region.

17. The image sensor of claim 14, wherein the first voltage is higher than the second voltage.

18. An image sensor, comprising:
a sensor array including pixels that respectively convert an optical signal into a corresponding electrical output; and
a timing generator controlling the sensor array,
wherein each of the pixels includes a light-sensing element that generates charge in response to the optical signal, a storage diode formed in a substrate that stores the charge generated by the light-sensing element, a floating diffusion region formed in the substrate and spaced apart from the storage diode in a first direction, and a transfer gate buried in the substrate in the first direction, and
the transfer gate controls the transfer of charge from the light-sensing element to the storage diode in response to a first transfer signal provided by the timing generator, and the transfer of charge from the storage diode to the floating diffusion region in response to a second transfer signal provided by the timing generator.

19. The image sensor of claim 18, wherein the first transfer signal has a first voltage, and the second transfer signal has a second voltage different from the first voltage.

20. The image sensor of claim 19, wherein the first voltage is higher than the second voltage.

* * * * *